(12) United States Patent
Chu et al.

(10) Patent No.: US 7,646,573 B2
(45) Date of Patent: *Jan. 12, 2010

(54) METHOD FOR IMPROVED TRIGGERING AND OSCILLATION SUPPRESSION OF ESD CLAMPING DEVICES

(75) Inventors: Albert M. Chu, Essex, VT (US); Robert J. Gauthier, Jr., Hinesburg, VT (US); Junjun Li, Williston, VT (US); Thomas W. Wyckoff, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/133,424

(22) Filed: Jun. 5, 2008

(65) Prior Publication Data

US 2008/0232012 A1 Sep. 25, 2008

Related U.S. Application Data

(63) Continuation of application No. 11/276,411, filed on Feb. 28, 2006, now Pat. No. 7,397,641.

(51) Int. Cl.
*H02H 9/00* (2006.01)
*H02H 1/00* (2006.01)

(52) U.S. Cl. ........................................... 361/56
(58) Field of Classification Search ..................... 361/56
See application file for complete search history.

(56) References Cited

U.S. PATENT DOCUMENTS 5,521,783 A 5/1996 Wolfe et al.
5,825,601 A 10/1998 Statz et al.
5,946,175 A 8/1999 Yu
6,091,593 A 7/2000 Lin
6,621,673 B2 9/2003 Lin et al.
6,624,992 B1 9/2003 Aparin
6,690,555 B1 2/2004 Pasqualini
6,919,602 B2 7/2005 Lin et al.
6,947,267 B2 9/2005 Liu et al.
7,274,546 B2 9/2007 Gauthier et al.
2001/0036050 A1 11/2001 Lee et al.

(Continued)

OTHER PUBLICATIONS

Lee et al.; "Noise-Aware Design for ESD Reliability in Mixed-Signal Integrated Circuits;" IEEE 2001; pp. 437-441.
K. Iniewski et al.; "Design Strategies for ESD Protection in SOC;" Proceedings of the 4th IEEE International Workshop on System-on-Chip for Real-Time Applications (IWSOC '04); Jul. 2004.

(Continued)

*Primary Examiner*—Ronald W Leja
(74) *Attorney, Agent, or Firm*—Cantor Colburn LLP; Michael LeStrange

(57) ABSTRACT

An apparatus for protecting an integrated circuit from electrostatic discharge (ESD) includes an RC trigger device configured between a pair of power rails, a first control path coupled to the RC trigger device, and a second control path coupled to the RC trigger device. A power clamp is configured between the power rails for discharging current from an ESD event, the power clamp having an input coupled to outputs of the first and second control paths, the power clamp independently controllable by the first and second control paths. The first and second control paths are further configured to prevent the power clamp from reactivating following an initial deactivation of the power clamp.

5 Claims, 3 Drawing Sheets

U.S. PATENT DOCUMENTS

2002/0066929 A1 6/2002 Voldman
2003/0235020 A1 12/2003 Fukuda
2005/0068702 A1 3/2005 Connor et al.
2006/0176626 A1 8/2006 Griesbach et al.

OTHER PUBLICATIONS

T. J. Maloney et al; "Protection of High Voltage Power and Programming Plus;" IEEE Transactions of Components, Packaging and Manufacturing Technology—Part C, vol. 21, No. 4, Oct. 1998, pp. 250-256.

METHOD FOR IMPROVED TRIGGERING AND OSCILLATION SUPPRESSION OF ESD CLAMPING DEVICES

CROSS-REFERENCE TO RELATED APPLICATION

This application is a continuation of U.S. patent application Ser. No. 11/276,411, filed Feb. 28, 2006, now U.S. Pat. No. 7,397,641, the disclosure of which is incorporated by reference herein in its entirety.

BACKGROUND

The present invention relates generally to electrostatic discharge (ESD) in integrated circuits, and, more particularly, to an apparatus and method for improved triggering and oscillation suppression of ESD power clamping devices.

ESD events, which can occur both during and after manufacturing of an integrated circuit (IC), can cause substantial damage to the IC. ESD events have become particularly troublesome for complementary metal oxide semiconductor (CMOS) chips because of their low power requirements and extreme sensitivity. A significant factor contributing to this sensitivity to ESD is that the transistors of the circuits are formed from small regions of N-type materials, P-type materials, and thin gate oxides. When a transistor is exposed to an ESD event, the charge applied may cause an extremely high current flow to occur within the device, which in turn can cause permanent damage to the junctions, neighboring gate oxides, interconnects and/or other physical structures.

In particular, there are three general types of ESD events that have been modeled: the human body model (HBM), the machine model (MM) and the charged device model (CDM). The HBM and MM represent discharge current between any two pins on an IC as a result of (respectively) a human body discharging through a chip and a metal tool discharging through a chip. Whereas a human body discharge is relatively slow in terms of rise time and has a unidirectional current in the range of about 1-3 amps, a tool discharge is a relatively rapid event that produces an even higher, bidirectional current into and out of the pin (e.g., about 3-5 amps). In the CDM, the ESD event does not originate from outside the IC device itself, but instead represents the discharge of an IC device to ground. The IC device is charged through the triboelectric effect (frictional charging) or by an external field. The charging of the device substrate itself does not subject the IC to ESD damage, but rather the discharging. As is the case with the MM, the CDM is a very rapid event.

Because of the potential damage from such types of ESD events, on-chip ESD protection circuits for CMOS chips have become commonplace. In general, such protection circuits include ESD clamps configured to maintain the voltage at a power line to a value that is known to be safe for the operating circuits, and that will also not interfere with the operating circuits under normal operating conditions. An ESD clamp circuit is typically constructed between a positive power supply (e.g., $V_{DD}$) and a ground plane, or a ground plane and a negative power supply (e.g., $V_{SS}$). The primary purpose of the ESD clamp is to reduce the impedance between the rails $V_{DD}$ and $V_{SS}$ so as to reduce the impedance between the input pad and the $V_{SS}$ rail (i.e., discharge of current between the input to $V_{SS}$), and to protect the power rails themselves from ESD events.

The continued scaling of semiconductor devices has resulted in some unique challenges for providing ESD protection in CMOS applications. For example, ESD power clamps should reduce leakage current during fast power up states in order to minimize battery power loss, but at the same time should still maintain a desired level of ESD protection. Unfortunately, existing circuit topologies that provide sufficient ESD protection do not also prevent oscillation of the ESD power clamps as a result of the interaction of high transient current with the package inductance/resistance of the package.

SUMMARY

The foregoing discussed drawbacks and deficiencies of the prior art are overcome or alleviated by an apparatus for protecting an integrated circuit from electrostatic discharge (ESD). In an exemplary embodiment, the apparatus includes an RC trigger device configured between a pair of power rails, a first control path coupled to the RC trigger device, and a second control path coupled to the RC trigger device. A power clamp is configured between the power rails for discharging current from an ESD event, the power clamp having an input coupled to outputs of the first and second control paths, the power clamp independently controllable by the first and second control paths. The first and second control paths are further configured to prevent the power clamp from reactivating following an initial deactivation of the power clamp.

In another embodiment, a method for protecting an integrated circuit from electrostatic discharge (ESD) includes configuring an RC trigger device between a pair of power rails and coupling first and second control paths to the RC trigger device. A power clamp is configured between the power rails for discharging current from an ESD event, said power clamp having an input coupled to outputs of the first and second control paths, the power clamp independently controllable by the first and second control paths. The first and second control paths are further configured to prevent the power clamp from reactivating following an initial deactivation of the power clamp.

BRIEF DESCRIPTION OF THE DRAWINGS

Referring to the exemplary drawings wherein like elements are numbered alike in the several Figures.

DETAILED DESCRIPTION

Disclosed herein is an apparatus and method for improved triggering and oscillation suppression of electrostatic discharge (ESD) power clamping devices. Briefly stated, separate inverter stages are used in an ESD protection circuit to provide a first and a second control path with respect to a FET clamp. By using independent inverter stages with different switch points, the problem of power rail oscillations during fast power-up conditions is eliminated. Additional advantages of the embodiments presented herein will also become apparent.

Figure 1:
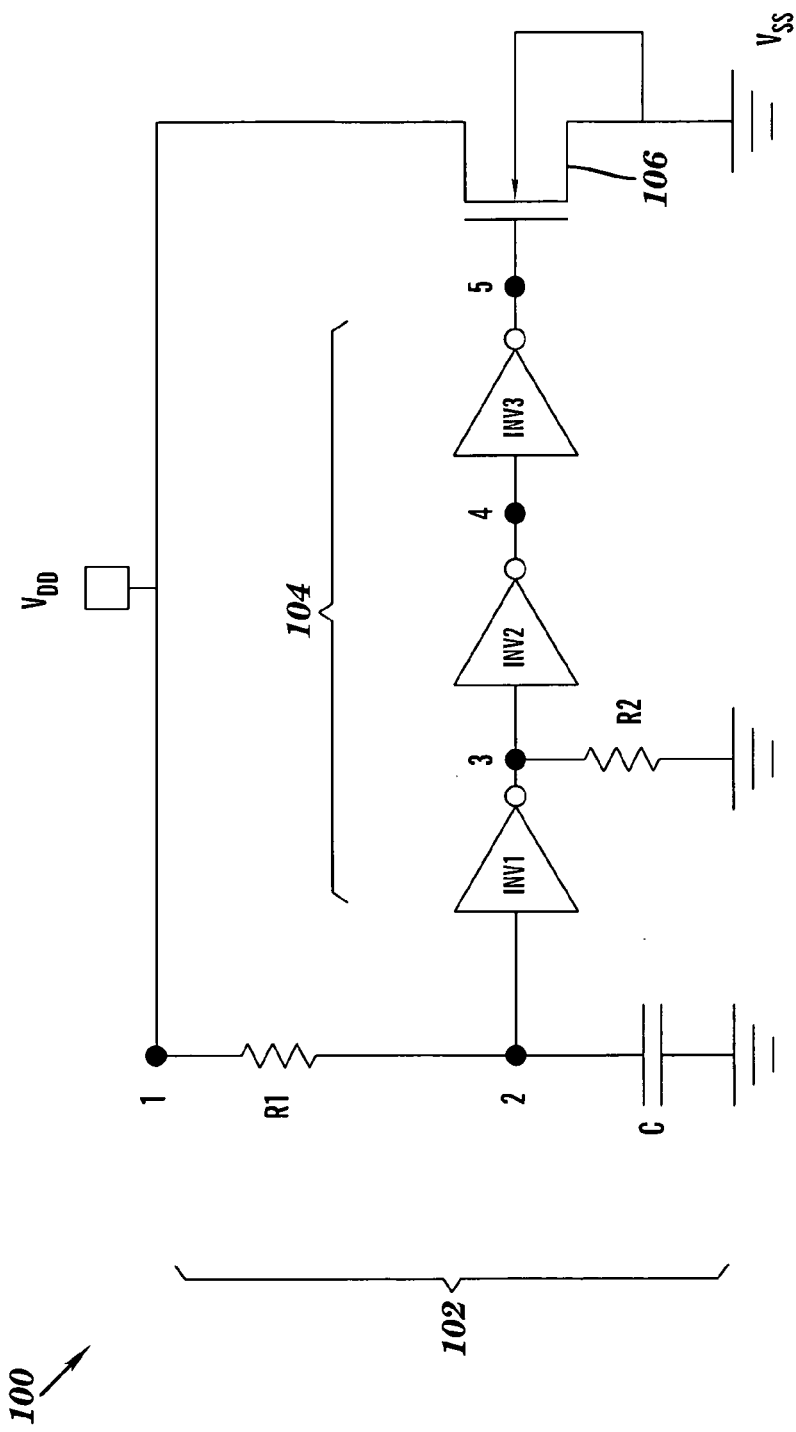
FIG. 1 is a schematic diagram of an existing configuration of an ESD clamp, including a trigger device and one or more clamping (discharge) devices.

Referring initially to FIG. 1, there is shown a schematic diagram of an existing ESD clamp circuit 100 configured between a pair of power rails. In the example illustrated, the rails are shown as nominally being powered by $V_{DD}$ and ground potential. However, the clamp 100 may also be configured between power rails of different voltage levels (e.g., $V_{DDX}$ and $V_{DDY}$), as well as between ground and $V_{SS}$ (negative potential), for example. As is well known in the art, the ESD clamp circuit 100 includes an RC trigger device 102 (having resistor R1 and capacitor C), an inverter stage 104 (having individual inverters INV1, INV2, INV3) and a large FET 106 (e.g., an NFET) serving as a power clamp for sinking ESD current. A resistor R2 is coupled to the output of INV1 to assist in initializing the gate of FET 106 to a low state during power up and also to help lock the gate of FET 106 to a low start during normal circuit operation.

In order to provide sufficient protection from an ESD event (such as the types discussed above), the time constant of the RC trigger device 102 is selected to be sufficiently large enough to cover the duration of the ESD event (e.g., around 1 μs or more). When an ESD voltage spike appears on a power rail pin, the capacitance of the capacitor C of the RC trigger 102 initially prevents the voltage at the input (node 2) of the first inverter INV1 from immediately following the rise in the voltage on the power rail. As such, the output of the third inverter INV3 (node 5) will initially remain "high" with respect to the threshold voltage of the power clamp FET 106. This allows FET 106 to be biased in a conductive state for the duration of the ESD event so as to limit the rise in voltage on the power rail, thus protecting the IC circuitry.

Figure 2:
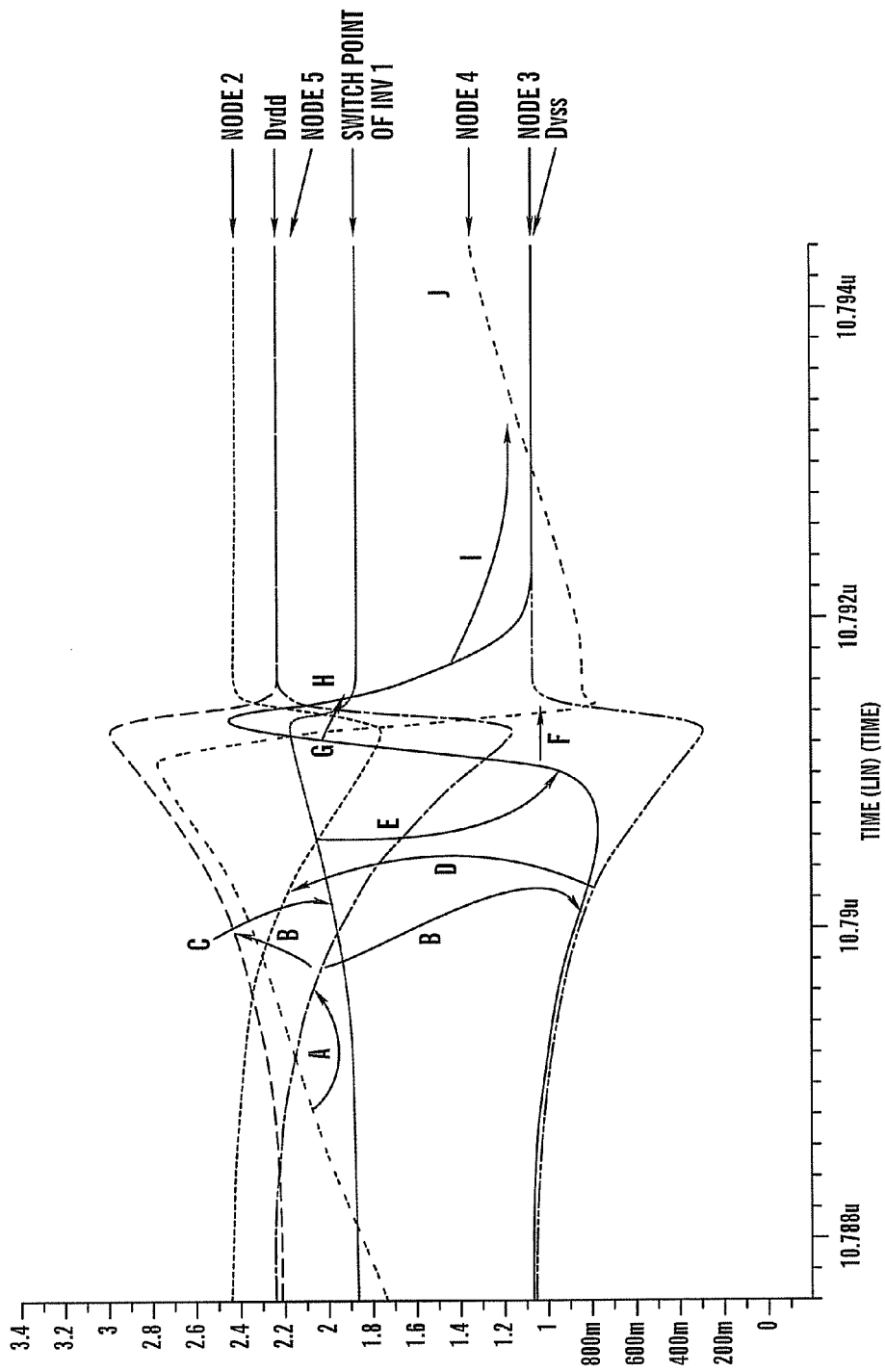
FIG. 2 is a waveform timing diagram illustrating the oscillation effect of the circuit of FIG. 1 during a fast power-up condition.

However, during a fast power up condition, it is desirable to also be able to turn off the power clamp FET and reduce oscillation of the voltage on the power rails. This phenomenon associated with the circuit of FIG. 1 is further illustrated with reference to the waveform timing diagram of FIG. 2. As shown in FIG. 2, the initially illustrated value of the voltage at node 2 of circuit 100 is about 2.4 volts following a power-up condition. As this node 2 voltage represents a transition from logic low (in the unpowered state) to logic high for the input of INV1, it is also seen that the initial value of the voltage at node 3 is about 1.1 volts (representing a transition from high to low).

It is further seen from the initial values shown in FIG. 2 that the output voltage of INV2 (node 4) is at about 1.7 volts and rising, meaning that it has not quite transitioned from low to high at this point in time. Accordingly, because node 4 has not yet transitioned to logic high, the output of INV3 (node 5), which is the gate voltage of power clamp FET 106, is still at a "high value" of about 2.2 volts. The circuit 100 thus continues to provide ESD protection to this point.

Eventually, the rising value of the voltage at node 4 reaches a logic high level that causes the output of INV3 (node 5) to transition from logic high to logic low, as reflected by the portion of the graph labeled "A" in FIG. 2. Once node 5 reaches a logic low level, the power clamp FET 106 then turns off, thereby decoupling $V_{DD}$ and $V_{SS}$ and allowing the voltages thereon to increase and decrease, respectively. This is shown at points "B" of FIG. 2. As a result of the decoupling of $V_{DD}$ and $V_{SS}$, the growing difference therebetween causes the switch point of inverter INV1 to increase as shown at point "C". At the same time, the voltage value at node 2 (being more strongly coupled to $V_{SS}$ than to $V_{DD}$) begins to decrease along with $V_{SS}$, as shown at point "D". The combination of a rising switch point of INV1 with a falling voltage at node 2 results in a transition of the output of INV1 (node 3) back from logic low to logic high, as shown at point "E".

Then, because node 3 is again at logic high, the output of INV2 (node 4) switches back from high to low, as shown at point "F". In turn, node 5 switches from low to high, thereby turning on the power clamp FET 106 and once again collapsing the values of $V_{DD}$ and $V_{SS}$ toward one another as shown at point "G". Since the values of $V_{DD}$ and $V_{SS}$ are now converging due to the reactivation of power clamp FET 106, the switch point of INV1 now decreases. In addition, the voltage at node 2 again rises since it is coupled to $V_{SS}$, as shown at point "H". The combination of the increase in voltage at node 2 with a falling switch point of INV1 changes the state of node 3 from high to low, as shown at point "I". Finally, the transition of node 3 from high to low causes the voltage at node 4 to once again increase, as shown at point "J". Once this value of the node 4 voltage reaches the level as shown at the extreme left portion of FIG. 2, the above described cycle repeats once again.

It will thus be seen that a fast power-up ramp rate applied to the conventional clamp circuit 100 of FIG. 1 creates an oscillating condition that results in unstable power rail voltages, as well as undesirable power consumption through repeated cycling of the power clamp FET 106.

Figure 3:
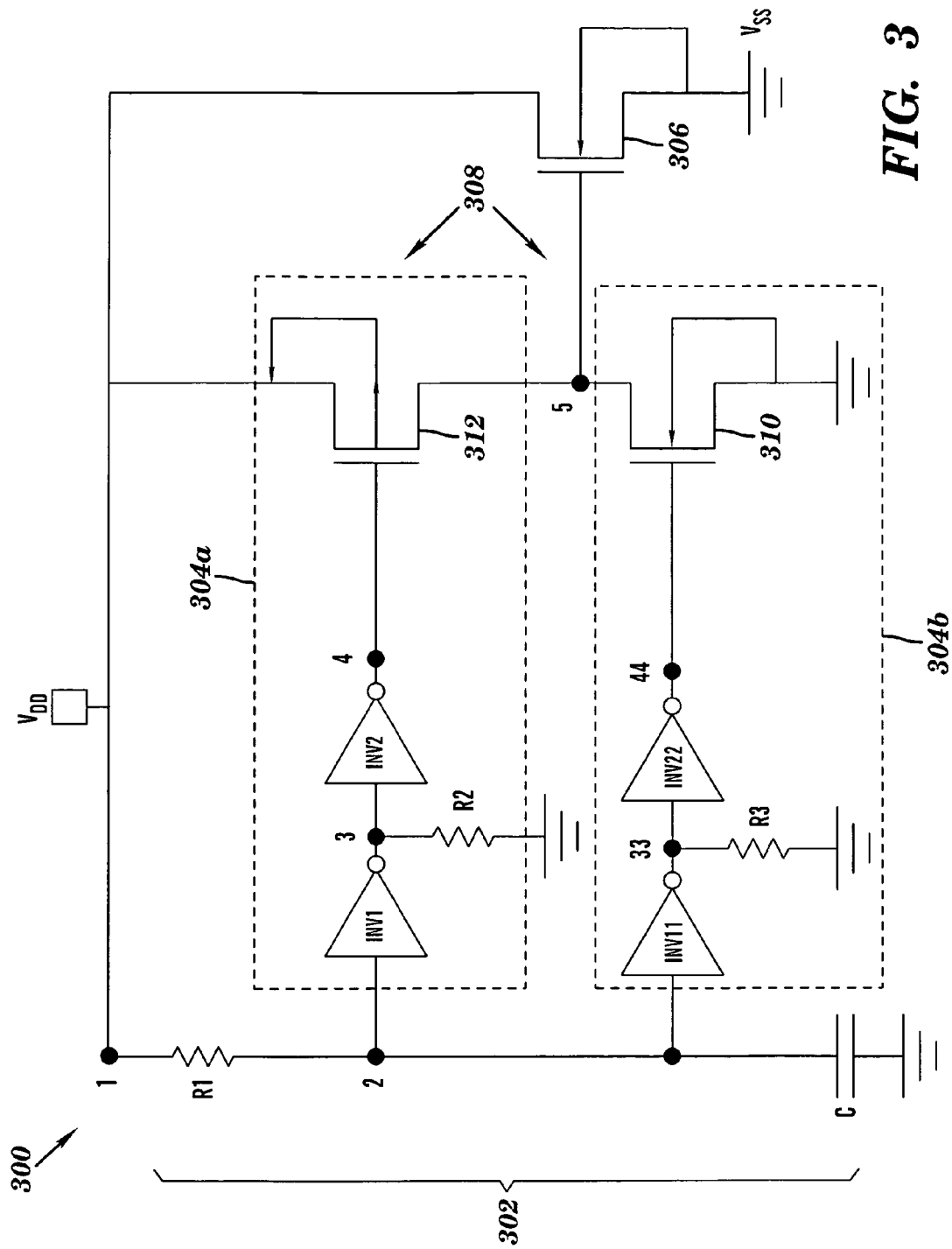
FIG. 3 is a schematic diagram of an apparatus for improved triggering and oscillation suppression of electrostatic discharge (ESD) power clamping devices, in accordance with an embodiment of the invention.

Therefore, in accordance with an embodiment of the invention, FIG. 3 is a schematic diagram of an improved ESD protection circuit 300 for implementing oscillation suppression of an ESD clamp. In the embodiment depicted, the circuit 300 includes an RC trigger device 302 coupled to a first control path 304a and a second control path 304b, both of which are in turn coupled to the gate of power clamp NFET 306. The first control path 304a includes inverters INV1, INV2, while the second control path 304b includes inverters INV11, INV22. In contrast to INV3 of FIG. 1, the gate of power clamp NFET 306 is independently controlled by an NFET/PFET stage 308, having an NFET 310 coupled to the output of INV22 of the second control path 304b and a PFET 312 coupled to the output of INV2 of the first control path 304a.

As discussed below, the independent operation of the first and second control paths 304a, 304b, in controlling the power clamp NFET 306 provides the advantages of ESD protection in a manner that also dampens oscillation of the power rails during a fast power-up event. This is made possible by configuring inverter INV1 of the first control path 304a to have a lower switch point than that of inverter INV11 of the second control path 304b.

During a fast power-up ramp, the clamp device 306 is initially ON, so as to clamp a possible ESD event. As the voltage on node 2 begins to charge up, inverter INV1 of the first control path 304a is designed to be triggered first (i.e., node 3 switches from high to low before node 33 switches from high to low). Upon this transition at node 3, the output of INV2 (node 4) switches from low to high, thereby turning off PFET 312. However, because node 4 is only coupled to PFET 312 (and not to an inverter as in the case of the conventional clamp circuit 100), the gate of power clamp NFET 306 is left floating high instead of being pulled low. Therefore, power clamp NFET 306 remains conductive to this point.

Then, as node 2 continues to charge up, inverter INV11 of the second control path 304b will now change state as node 33 transitions from high to low, causing node 44 to change from low to high and turn on the pull down NFET 310, thereby shutting off the power clamp NFET 306. Once the power clamp NFET 306 is turned off, the voltage levels on the power rails will begin to diverge as described above. Although the second control path 304b may initially begin to exhibit the oscillatory behavior of the control circuit 100 of FIG. 1 (i.e., a declining node 2 voltage coupled to $V_{SS}$, causing a change in state of inverters INV11 and INV22), the fact that NFET 310 is deactivated does not mean that power clamp NFET 306 is once again turned on. This is due to the fact that node 5 will be floating at a low level instead of being pulled up to high by PFET 312. Again, since INV1 has a lower switch point, it will not have the chance to switch states and cause the first control path 304a to oscillate. Thus, since power clamp NFET 306 remains in the off state, the node 2 voltage eventually recovers and charges to a full power-up level. The second control path 304b will stabilize such that NFET 310 remains conductive, pulling the gate of power clamp NFET 306 to ground.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for protecting an integrated circuit from electrostatic discharge (ESD), the method comprising:
    configuring an RC trigger device between a pair of power rails;
    coupling first and second control paths to said RC trigger device;
    configuring a power clamp between said power rails for discharging current from an ESD event, said power clamp having an input coupled to outputs of said first and second control paths, and said power clamp independently controllable by said first and second control paths;
    wherein said first and second control paths are further configured to prevent said power clamp from reactivating following an initial deactivation of said power clamp.

2. The method of claim 1, wherein said power clamp further comprises an NFET.

3. The method of claim 2, wherein said first control path further comprises:
    a first inverter coupled to said RC trigger device;
    a second inverter coupled to an output of said first inverter; and
    a PFET switch having a gate thereof coupled to an output of said second inverter, said PFET switch further coupled to a gate of said power clamp.

4. The method of claim 3, wherein said second control path further comprises:
    a third inverter coupled to said RC trigger device, at a common node with respect to said first inverter;
    a fourth inverter coupled to an output of said third inverter; and
    an NFET switch having a gate thereof coupled to an output of said third inverter, said NFET switch further coupled to said gate of said power clamp.

5. The method of claim 4, wherein said first inverter is configured to have a lower switch point with respect to said third inverter, wherein said lower switch point of said first inverter prevents a chance in state of said third inverter from reactivating said power clamp.

* * * * *